United States Patent [19]

Thomas et al.

[11] 4,416,051

[45] Nov. 22, 1983

[54] RESTORATION OF HIGH INFRARED SENSITIVITY IN EXTRINSIC SILICON DETECTORS

[75] Inventors: Richard N. Thomas, Murrysville; Timothy T. Braggins, Penn Hills, both of Pa.

[73] Assignee: Westinghouse Electric Corp., Pittsburgh, Pa.

[21] Appl. No.: 166,421

[22] Filed: Jul. 7, 1980

Related U.S. Application Data

[62] Division of Ser. No. 5,535, Jan. 22, 1979, Pat. No. 4,246,590.

[51] Int. Cl.$^3$ .................................. H01L 21/225
[52] U.S. Cl. .................................. 29/572; 29/576 B; 148/1.5; 148/186
[58] Field of Search ............... 148/1.5, 186; 29/576 B, 29/572

[56] References Cited

U.S. PATENT DOCUMENTS

| | | | |
|---|---|---|---|
| 3,449,177 | 6/1969 | Huth et al. | 29/577 X |
| 3,791,884 | 2/1974 | Dathe et al. | 148/1.5 X |
| 4,053,335 | 10/1977 | Hu | 148/174 |
| 4,115,798 | 9/1978 | Platzoeder | 357/38 X |

Primary Examiner—G. Ozaki
Attorney, Agent, or Firm—R. M. Trepp

[57] ABSTRACT

A method and apparatus for removing heavy metal impurities such as gold, silver, nickel and copper from a crystalline substrate is described incorporating a damaged crystalline layer which may be formed by excessive doping to trap or getter heavy metal impurities to enhance the majority carrier lifetime of the detector material.

The invention overcomes the problem of degraded responsivity in radiant energy crystalline detectors after high temperature processing, in excess of 900° C., which permits surface contaminants such as gold, silver, nickel and copper to diffuse through the detector material raising the net donor density.

8 Claims, 8 Drawing Figures

RESTORATION OF HIGH INFRARED SENSITIVITY IN EXTRINSIC SILICON DETECTORS

GOVERNMENT CONTRACT

The government has rights in this invention pursuant to contract number DAAG-53-76-C-0170 awarded by the Defense Logistics Agency.

This is a division of application Ser. No. 005,535, filed Jan. 22, 1979, now U.S. Pat. No. 4,246,590.

BACKGROUND OF THE INVENTION

1. Field of the Invention

This invention relates to radiant energy sensors, and more particularly, to a radiant energy sensor employing a damaged crystalline layer caused by excessive doping to trap or getter heavy metal impurities to enhance the majority carrier lifetime of the detector material.

2. Description of the Prior Art

Monolithic silicon charge coupled devices (CCD) type sensors which are currently being developed for high performance infrared detection and imaging systems utilize extrinsic indium or gallium doped silicon substrates. For many applications, extrinsic substrate material of extremely high quality is needed, for example, substrates of high or long carrier lifetimes are required for the high data rates utilized in forward looking infrared (FLIR) type scanned arrays. High carrier lifetimes are also important in the self-scanned staring sensors. This insures that for performance at very low background photon fluxes, the detector provides sufficient detector signal and consequent detector noise which exceeds the inherent CCD noise. Otherwise the detector would be limited by CCD noise.

It is widely recognized that the shallow acceptors, $N_A$, such as boron, which are unavoidably present as residual impurities in highly doped P-extrinsic silicon, must be compensated as closely as possible by donor impurities, $N_D$, such as phosphorus, in order to achieve high lifetime detector material. The use of neutron transmutation of silicon for introducing known amounts of phosphorus into extrinsic indium doped silicon to produce precision compensated infrared detector material has been developed and described in an article by R. N. Thomas, T. T. Braggins, H. M. Hobgood, and W. J. Takei, published in the Journal of Applied Physics, Vol. 49, page 2811 (1978). Extrinsic detector material with net $(N_D-N_A)$ donor densities as low as $2 \times 10^{12}$ cm$^{-3}$ have been achieved using neutron transmutation of silicon.

In the prior art a damaged crystalline layer has been formed by high concentrations of impurity atoms in silicon power and switching transistors to enhance the minority carrier lifetime in the material.

In the fabrication of infrared monolithic silicon focal plane arrays (MFPA), an extrinsic substrate is subjected to a variety of processing steps including thermal oxidation, P+ and N+ diffusions, epitaxial growth, silox and polysilicon depositions, etc., where temperatures as high as 1100° C. are normally employed. The quality of an extrinsic silicon substrate is adversely affected by high temperature processing. Specifically, a very large increase in the net donor compensation of an indium doped silicon substrate was observed after CCD fabrication. The net donor density of the virgin substrate material was observed to increase from about $5 \times 10^{12}$ cm$^{-3}$ to $1.4 \times 10^{14}$ cm$^{-3}$ for the processed material.

Similar large increases in the net donor density were observed in other Si:In substrates when these were subjected to a high single high temperature boron diffusion. For example, when a shallow boron diffusion was performed from a BBr$_3$ source at 1100° C. for 70 minutes into a wafer, an approximately 100 fold increase in the net donor density was observed. The data suggests that carrier lifetime, and therefore responsivity is drastically reduced by conventional high temperature silicon processing.

The adverse effects of high temperature processing on the quality of extrinsic silicon substrate has serious implications in monolithic silicon focal plane array (MFPA) fabrication technology. Certain lower temperature processes such as ion implantation with 600°-800° C. anneal, high pressure dielectric depositions, etc., can be utilized; however, temperatures of 1000° to 1050° C. are still required for silicon epitaxy. The high donor densities which are apparently introduced into the extrinsic substrate during high temperature processing are not well understood at present. The effects associated with the diffusion or redistribution of the conventional, slow diffusing donor impurities, such as phosphorus or arsenic, seem unlikely and are typically confined to depths of only a few micrometers from the surface. Similarly, possible oxygen donor activation, which occurs in crucible pulled silicon, is unknown in the low oxygen content, float zone silicon used while investigating this phenomena.

It is therefore desirable to restore infrared sensitivity in P-extrinsic detectors following high temperature processing.

It is further desirable to provide a damaged crystalline layer to trap or getter impurities or donor atoms from the extrinsic silicon material of the detector.

It is further desirable to provide a damaged crystalline layer by diffusing a high concentration of impurities such as $10^{19}$ cm$^{-3}$.

SUMMARY OF THE INVENTION

In accordance with the present invention, a sensor is provided for converting radiant energy into electrical signals comprising a substrate having a first and second surface including means for passing radiant energy into the substrate, the substrate including doping atoms for generating electronic charge in response to the absorption of radiant energy, a first electrode formed in the first surface, a second electrode formed in the second surface, means for coupling a first voltage across the first and second electrodes to attract electronic charge to the first electrode, means for providing a signal indicative of the electronic charge on said first electrode, and a damaged crystalline layer formed in the second surface which holds donor impurities which diffuse rapidly at temperatures above 900° C. to enhance the majority carrier lifetime of the generated electronic charge in the substrate.

The invention further provides a method for restoring high radiant energy sensitivity in crystalline detector material after detector fabrication comprising the steps of: forming a damaged crystalline layer in said detector material and raising the temperature of said detector material for a period of time to allow impurities which diffuse readily in said detector material to be trapped by said damaged crystalline layer to enhance the majority carrier lifetime of the detector material.

DESCRIPTION OF THE PREFERRED EMBODIMENTS

Figure 1:
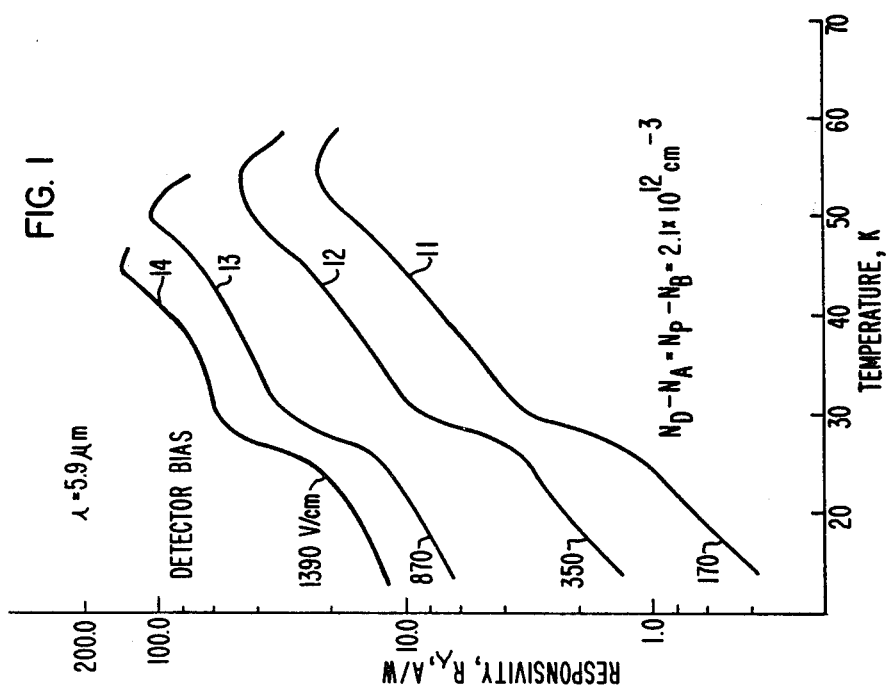
FIG. 1 is a graph of the responsivity of a precision compensated indium doped silicon detector as a function of temperature.

Referring to FIG. 1, a graph is shown of the responsivity of a precision compensated indium doped silicon detector as a function of temperature. In FIG. 1 the ordinate represents responsivity and the abscissa represents temperature. Curves 11-14 have increasing detector bias across the detector which is comprised of silicon doped with indium and having shallow acceptors, such as boron compensated closely by donor impurities, such as phosphorus, to achieve high lifetime detector material. The extrinsic detector material used for making the measurements in FIG. 1 had a net donor density $(N_D-N_A)$ as low as $2\times10^{12}$ cm$^{-3}$. Curve 13 illustrates that peak infrared responsivities as high as 106 amps/watts at a detector bias of 870 volts/centimeters have been measured at 50° K. operation.

Figure 2:
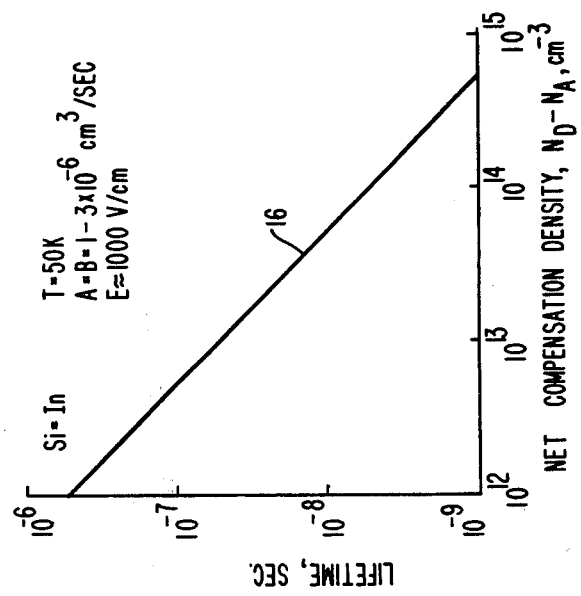
FIG. 2 is a graph of the measured lifetime t at 50° K. as a function of the net donor compensation density.

FIG. 2 is a graph of the measured lifetime t, at 50° K. as a function of net donor compensation density. In FIG. 2 the ordinate represents lifetime in seconds and the abscissa represents net compensation density $N_D-N_A$ cm$^{-3}$. FIG. 2 shows that the measured lifetime, t, at 50° K. increases as the net donor compensation density, $N_D-N_A$ is reduced according to Equation 1.

$$t = 1/BN_{In}^{-} = 1/B(N_D - N_A) \quad (1)$$

where B is the recombination coefficient and $N_{In}^{-}$ is the ionization indium concentration which is equal to $N_D-N_A$. The term $N_{In}^{-}$ represents the number of ionized indium atoms cm$^{-3}$ due to the attachment of an electron contributed by a donor impurity. The term $N_D$ represents the number of electrons donated by the donor impurity cm$^{-3}$. The term $N_A$ represents the number of shallow acceptors or holes cm$^{-3}$ of the detector by the presence of impurities such as boron which may be unavoidably present as residual impurities after processing. In FIG. 2, curve 16 shows the lifetime t increases as $N_D-N_A$, the net donor compensation is reduced.

Figure 3:
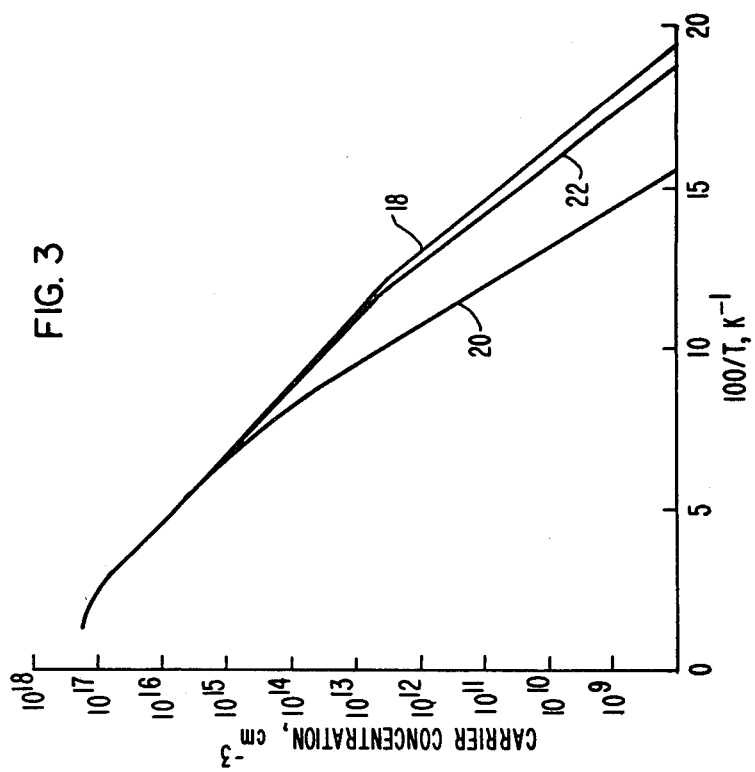
FIG. 3 is a graph of the carrier concentration in a detector as a function of 1/temperature.

FIG. 3 is a graph of the carrier concentration in a detector as a function of 1/temperature. In FIG. 3 the ordinate represents carrier concentration in cm$^{-3}$ and the abscissa represents the inverse of temperature. The carrier concentration represents the number of thermally excited carriers in the material at a particular temperature. The carrier concentration was measured using Hall effect measurements. The net donor density was determined by utilizing a mathematical formula for converting from carrier concentration to net donor density. The equation for deriving net donor density from the carrier concentration is found as Equation 5 in an article entitled "Compensation of Residual Boron Impurities in Extrinsic Indium Doped Silicon by Neutron Transmutation of Silicon" by R. N. Thomas, T. T. Braggins, H. M. Hobgood, and W. J. Takei, published in the Journal of Applied Physics 49, page 2811 (1978), which article is incorporated herein by reference. The article also includes a discussion of Hall effect measurements for indium doped silicon which is applicable herein. Curves 18, 20 and 22 represent data from indium doped silicon substrates having an indium concentration of $2.2\times10^{17}$ cm$^{-3}$ which is utilized for fabricating detectors. Material from the same substrate was divided with one part being subjected to a low temperature process. The material was raised to 650° C. during sintering of aluminum contacts. Following the low temperature process curve 18 was derived from measurements showing the carrier concentration as a function of the inverse of temperature. From the carrier concentration and using the aforementioned equation the net donor density was determined to be $2.1\times10^{12}$ cm$^{-3}$. Another portion of the substrate material was processed at 1100° C. during the diffusion of boron P+ contacts. The boron diffusion was shallow and was performed from a BBr$_3$ source at 1100° C. for 70 minutes into the wafer. Measurements after the high temperature processing on the material is shown by curve 20 in FIG. 3. By utilizing the data in FIG. 3, the net donor density was determined to be $2.4\times10^{14}$ cm$^{-3}$. A comparison of the net donor density of the material after low temperature processing at 650° C. and high temperature processing of 1100° C., curves 18 and 20, respectively, show that the indium doped silicon material had a 100 fold increase in net donor density, from $2.1\times10^{12}$ cm$^{-3}$ for curve 18 to $2.4\times10^{14}$ cm$^{-3}$ for curve 20.

Figure 7:
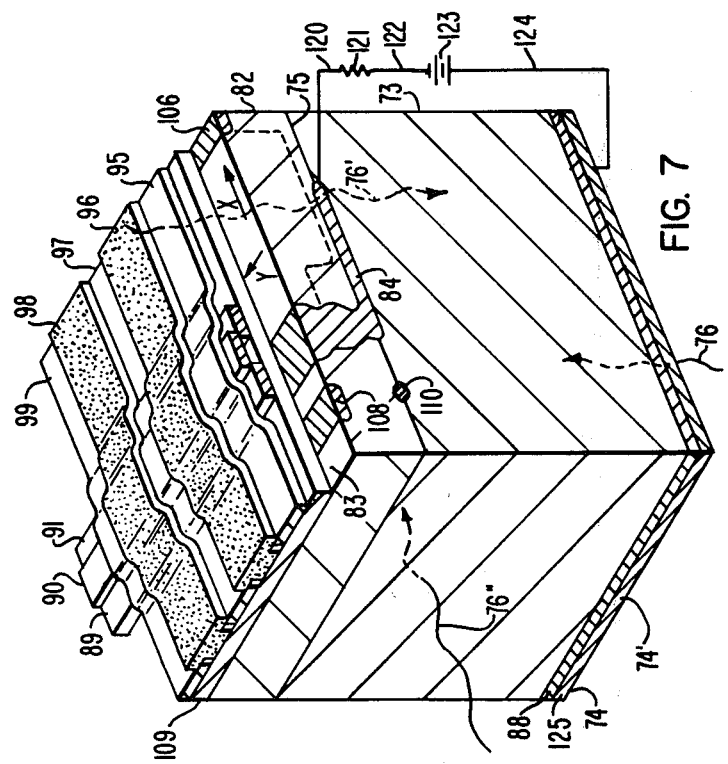
FIG. 7 is one embodiment of the invention.

Curve 22 represents data taken from indium doped silicon material processed at high temperature such as 1100° C. followed by utilizing the method or apparatus of this invention as shown in FIG. 7 to provide a damaged crystalline layer in the material for gettering impurities. Curve 22 shows that material exhibiting a carrier concentration over temperature and hence donor density levels of $2.4\times10^{14}$ after processing at 1100° C. as shown in curve 20 may be stored to a lower donor density such as $6.5\times10^{12}$ cm$^{-3}$ on curve 22 by incorporating a damaged crystalline layer which can trap, hold or remove donor impurities in the silicon material. Other materials such as germanium and alloys thereof in addition to silicon and alloys thereof may be improved by providing a damaged crystalline layer in the material for gettering impurities.

Figure 4:
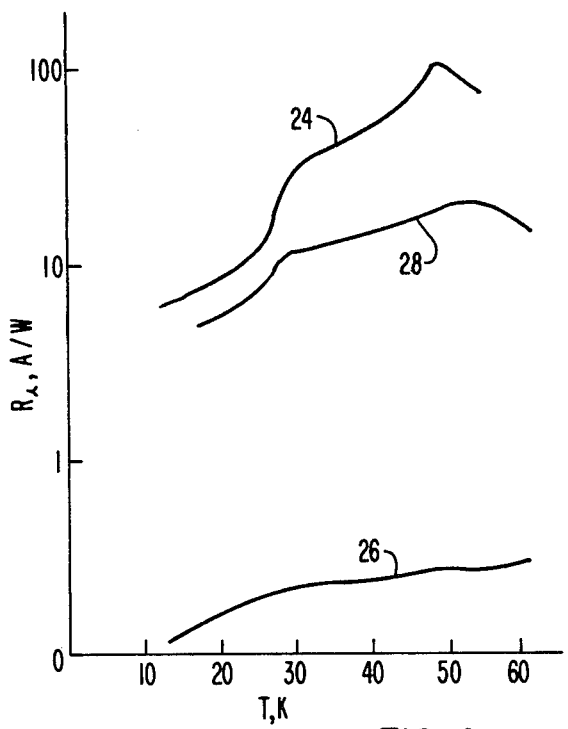
FIG. 4 is a graph of detector responsivity as a function of temperature.

FIG. 4 is a graph of detector responsivity as a function of the detector temperature. In FIG. 4 the ordinate represents responsivity in amps per watt and the abscissa represents temperature in degrees Kelvin. A high responsivity suggests that the carrier lifetime of the indium doped material is also high. Curve 24 shows the responsivity of a detector fabricated using a low temperature process of 650° C. for sintering aluminum contacts on an indium doped silicon substrate. Curve 26 shows the responsivity of a detector fabricated using boron diffused contacts which were diffused at a temperature of 1100° C., a high temperature process. Curve 28 shows the responsivity of a detector utilizing boron diffused contacts which were diffused at 1100° C. as in the detector of curve 26 with the addition of a process for gettering donor impurities from the bulk of the indium doped silicon detector material. The bias across the detector contacts for the detectors measured in curves 24, 26 and 28 was 870 volts/centimeter. As shown in FIG. 4 the responsivity of a detector fabricated from indium doped silicon is drastically reduced by conventional high temperature silicon processing such as the process of diffusing boron P+ contacts at 1100° C.

The loss of infrared sensitivity in P-extrinsic detectors following high temperature processing is believed to be related to heavy metal contamination distributed throughout the bulk of the detector, probably from surface contamination on the surface of the silicon wafers of low concentration. These impurities which include gold, silver, nickel and copper are fast-diffusers in silicon so that they become uniformly distributed throughout the thick (typically 0.025 to 0.051 cm) extrinsic substrate at high temperatures such as above 900° C. Gold, for example, exhibits an amphoteric chracteristic in that it exhibits a donor and acceptor level in silicon which has been described by W. M. Bullis in an article published in Solid State Electronics, Vol. 9, page 143 (1966).

The case of P-type boron-silicon containing gold impurities is of special interest. At room temperature, the resistivity increases monotonically with increasing gold concentrations, suggesting that the boron levels, which normally are fully ionized at room temperature, are compensated by the gold donor levels. The indiffusion of a gold-like amphoteric impurity having both donor and acceptor levels in P-extrinsic silicon during high temperature processing such as above 900° C. results in an increase in the effective net donor compensation density.

Figure 5:
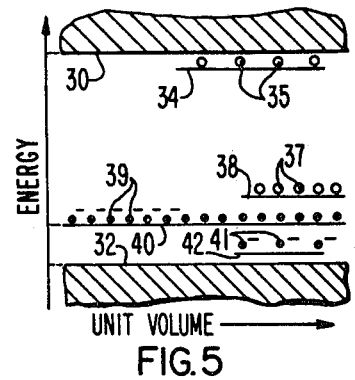
FIG. 5 is an energy level diagram showing the role of an impurity such as gold in limiting carrier lifetime in extrinsic indium doped silicon.

An amphoteric impurity such as gold in normally compensated indium doped silicon is depicted in FIG. 5. The gold donor levels increase the ionized indium concentration $N_{In}^-$ — which is now given by Equation (2).

$$N_{In}^- = N_{Au} + N_P - N_B \qquad (2)$$

The increase in ionized indium concentration $N_{In}^-$ results in a reduction or shortening of the carrier lifetime in the indium doped slicon which also results in a reduction in the detector responsivity. In FIG. 5 the ordinate represents energy and the abscissa represents a unit volume of detector material. Referring to FIG. 5, in a unit volume of detector material a conduction band 30 and a valence band 32 are shown spaced apart. The energy levels between the conduction band and the valence band is termed the energy band gap. Within the energy band gap are located phosphorus donors such as at a concentration proportional or greater than $10^{12}$ cm$^{-3}$ having an energy level 34. The phosphorus atoms 35 act as donors in the material and provide an electron for each atom. Gold atoms 37 are shown at an energy level 38 which may, for example, be at a concentration of $10^{14}$ cm$^{-3}$. Each atom provides an electron into the bulk material. Indium atoms 39 are shown having an energy level 40 in the material which may be at a concentration at or greater than $10^{17}$ cm$^{-3}$. Boron atoms 41 are shown at an energy level 42 which may be at a concentration in the material of $10^{12}$ cm$^{-3}$. If the material did not have gold impurities, then the lifetime would be according to Equation (1) where $N_D$ is the number of phosphorus donors and $N_A$ is the number of boron acceptors. However, with a gold-like impurity present and the material at or greater than 40° K. the lifetime, is described by Equation (3).

$$t \simeq 1/B(N_{Au} + N_P - N_B) \qquad (3)$$

In Equation (3) the number of donors, $N_D$, is now the number of phosphorus and gold donors, $N_{Au} + N_P$. The number of acceptors, $N_A$, is now the number of boron acceptors $N_B$. As shown in FIG. 5 with 9 donors (4 phosphorus atoms 35 and 5 gold atoms 37), 3 electrons are accepted by the boron leaving 6 electrons which ionize 6 indium atoms. The ionized indium atoms shorten the lifetime t of the material.

A method for restoring high radiant energy sensitivity to crystalline detector material such as germanium, silicon, and alloys thereof, after high temperature detector fabrication processes where impurities may be diffused throughout the material comprises the steps of forming a damaged crystalline layer in the detector material and raising the temperature of the detector material for a period of time to allow impurities which diffuse readily in the detector material to be trapped by the damaged crystalline layer to enhance the majority carrier lifetime of the detector material. The damaged crystalline layer may be formed by diffusion of $PH_3$ at 960° C. or $POCL_3$ at 1000° C. to provide a high concentration of atoms such as $10^{19}$ cm$^{-3}$ or above. The temperature of the detector material should be raised over 900° C. for a period of time to allow the impurities such as gold, silver, nickel or copper to be gettered or trapped in the diffused layer. The temperature of the material may be raised over 900° C. in the course of forming the damaged crystalline layer when the phosphorus dopant is diffused into the material to form the damaged crystalline layer causing gettering to occur concurrently with the formation of the gettering layer. The majority carrier lifetime of the material is enhanced by Equation 3 wherein the number of donors equals the number of acceptors such that the amount of ionized indium is minimal.

FIG. 3 shows the improvements which have been achieved in the net donor density when a high temperature boron diffused substrate is subjected to a subsequent phosphorus glass gettering step. Gettering was performed by $PH_3$ phosphorus glass deposition at 960° C. for about 30 minutes which removed gold donors in the bulk material by attracting gold atoms or trapping gold atoms in the phosphorus layer. The phorphorus layer should be a heavy diffusion which disrupts the lattice and creates a damaged layer in the material. One example of a damaged crystalline layer is the formation of an N+ phosphorus diffused layer less than or about 1 micrometer deep on the surface of the silicon. The net donor density, $N_D - N_A$ is reduced to $6.5 \times 10^{12}$ cm$^{-3}$ following gettering as shown in FIG. 3, curve 22 and has a corresponding improvement in detector responsivity as illustrated in FIG. 4, curve 28. In FIG. 4 it is shown that a responsivity of 20 amps/watt has been attained which is considerably better than the state of the art sensitivities for present day extrinsic silicon devices.

In conventional silicon devices, e.g., power devices, it is well known that the minority carrier lifetime is also adversely affected by heavy metal contamination. The lifetime here is that of the minority carrier, electrons in P-type silicon material and holes in N-type silicon material at room temperature and is determined by the band-to-band recombination via states near the midband gap. Gold, for example, is an effective lifetime reducing impurity in P- and N-silicon because of its deep acceptor and donor states. It is also widely recognized that in conventional silicon devices, significant restoration of the generation lifetime, that is the generation of carriers according to a test method, which is also degraded by high temperature processing, can be achieved by the use of chelating and gettering techniques. The word chelating used herein refers to the process of surface cleaning with various solutions known in the art.

Figure 6A:
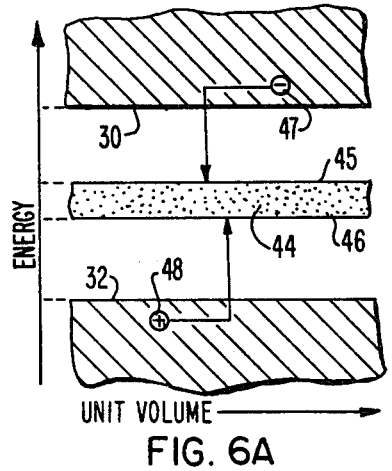
FIGS. 6A and 6B are energy level diagrams showing carrier recombination in conventional and extrinsic silicon respectively.
Figure 6B:
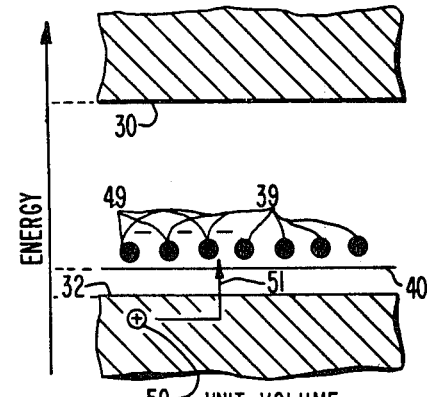

In extrinsic infrared focal plane arrays, the mechanism limiting carrier lifetime is quite different, i.e., recombination at ionized indium centers which is illustrated in FIGS. 6A and 6B. In FIGS. 6A and 6B the ordinate represents energy and the abscissa represents unit volume. In FIGS. 6A and 6B energy level diagrams are shown for carrier recombination in conventional and extrinsic silicon, respectively. Since the observed degradation in the infrared properties are believed to be related to the presence of heavy metal impurities, techniques which reduce the concentration of such impurities can be expected to be effective in improving the lifetime in extrinsic silicon devices, as shown in FIG. 5. In FIGS. 6A and 6B, like references are used corresponding to the description of FIG. 5. In FIG. 6A midband gap states 44 occurring between energy levels 45 and 46 are formed by impurities such as gold. The minority carrier lifetime in conventional silicon is determined by electron-hole recombination at the mid-band gap states 44. Electron 47 is shown in the conduction band 30 and hole 48 is shown in the valence band 32.

In FIG. 6B the photoconductive lifetime in extrinsic indium-doped silicon detectors is illustrated as being determined by majority carrier (holes) captured at ionized indium levels. The indium atoms 39 which are ionized are indicated by the additional reference level 49 and the minus sign above the atom. A hole 50 in the valence band 32 is shown being captured by an ionized indium atom 49 by arrow 51.

FIG. 7 shows one embodiment of the invention which is a perspective view with portions in cross section of an array of IR detectors to form a sensor for converting radiant energy into electrical signals. A substrate 73 having a first surface 74 and second surface 75 includes means for passing radiant energy into substrate 73. Substrate 73 may for example be silicon including doping atoms of indium or gallium for generating electronic charge in response to the absorption of radiant energy which may for example be infrared energy. A first electrode 84 is formed in the second surface 75. A second electrode 88 is formed in the first surface 74. First electrode 84 is coupled over line 120 through resistor 121 over line 122 to one side of battery 123 which provides a suitable voltage across the detector. The other side of battery 123 is coupled over line 124 to electrode 88 via layer 125. The voltage of battery 123 is sufficient to attract electronic charge to the first electrode 84. A damaged crystalline layer 125 is formed in the first surface 74 and will hold or trap donor impurities such as gold which diffuse or move rapidly at temperatures above 900° C. through the substrate into layer 125 to enhance the majority carrier lifetime of the bulk material between electrodes 84 and 88 and hence the lifetime of the generated electronic charge in the substrate 73 arising from absorption of radiant energy 76. Electrodes 89 through 91 are for transferring charge from electrode 84 to a well of a CCD device in semiconductor layer 82 between electrode 84 and P+ diffusion 106 which acts as a channel stopper along with P+ diffusion 108. Electrodes 95 through 99 function as CCD electrodes for transferring the charge out of the array. Electrodes 89 through 91 as well as electrodes 95 through 99 are insulated from each other and from semiconductor layer 82 by a dielectric layer 109 which may be silicon dioxide, aluminum oxide or silicon nitride. Electrode 110 may be biased to provide blooming control to remove excess carriers formed by intense radiation 76.

Electrode 84 may for example be rectangular or square-shaped on the surface 75 with a diffused portion extending to the upper surface 83 of semiconductor layer 82. A number of spaced apart electrodes 84 on surface 75 and over electrode 88 may form an array of detectors. FIG. 7 shows one example of typical CCD circuitry for a unit cell in an XY array of detectors for transferring signals from a detector. The signal in the form of charge passes in semiconductor layer 82 in the X direction under electrodes 89, 90 and 91 and then in the Y direction under electrodes 95 through 98 in sequence for a 4-phase CCD shift register.

Damaged crystalline layer 125 may for example be a shallow N+ layer less than 1 micrometer deep diffused in the deeper such as 2 to 3 micrometers P+ boron diffused electrode 88. When a bias voltage, typically 50 volts, is applied across the N epitaxial layer 82, also electrode 84 and N+ contact 125 on the first surface 74, almost all of the voltage will be across the extrinsic substrate 73 as desired. This occurs because of the very low voltage breakdown, approximately 1 volt, of the N+-P+ junction. In the fabrication of such a device, the principal consideration is that the phosphorus gettering be performed following all other high temperature processing steps. A phosphorus gettering step can logically be employed (1) after the last polysilicon layer has been deposited, a process incurring a temperature of 850° C., which may be used to form electrodes 89, 91, 95, 97 and 99; and also (2) after the N+ channel stoppers 106 and 108 are formed and after the dielectric layer 109 is formed which may incur a temperature up to 1100° C. Following the gettering step which forms damaged crystalline layer 125, contact windows in the dielectric coating are opened, an aluminum layer is deposited and a metallization pattern is sintered at about 500° C. for good ohmic contacts.

For a further description of the detector array shown in FIG. 7 reference is made to U.S. patent application Ser. No. 916,611, now abandoned, filed on June 19, 1978 by D. K. Schroder and assigned to the assignee herein which is incorporated herein by reference. FIG. 7 is shown in more views in FIGS. 6, 7 and 9 of the referenced application.

It is understood that in an alternate embodiment of FIG. 7 the damaged crystalline layer 125 may be etched off after the formation of layer 125 and after layer 125 has been used to getter the impurities leaving electrode 88 at surface 74'.

Damaged crystalline layer 125 may absorb or reduce the amount of radiant energy 76 passing through it. The amount of attenuation is dependent upon the wavelength of the radiation. The attenuation can vary considerably in the range of interest such as from 3 to 5 microns. Reference is made to U.S. Pat. No. 4,365,259 which issued on Dec. 21, 1982 on a continuation of an application from Ser. No. 962,833 now abandoned, filed on Nov. 21, 1978 by D. K. Schroder and assigned to the assignee herein which is directed to employing a heavily doped layer on the far side of a detector to absorb a portion of radiant energy to reduce optical crosstalk between detectors.

Depending upon the wavelength of radiation 76, layer 125 may be removed to improve performance or radiation 76 may be directed into the detector through the top surface 75 as shown by arrow 76' or parallel to layer 125 as shown by arrow 76'.

The invention describes a monolithic focal plane array structure modification which allows the use of phosphorus gettering in the correct sequence during fabrication to restore high infrared sensitivity to the extrinsic silicon substrate. In particularly, a damaged crystalline layer is formed in a surface of the substrate which holds down impurities which diffuse rapidly at temperatures above 900° C. to enhance the majority carrier lifetime of the material and hence, the generated electronic charge in the substrate. Specifically, the invention provides a method for restoring high sensitivity in radiant energy crystalline detector material after detector fabrication comprising the steps of forming a damaged crystalline layer in the detector material and raising the temperature of the detector material over 900° C. for a period of time to allow mobile impurities which diffuse readily in the detector material to be trapped by the damaged crystalline layer to enhance the majority carrier lifetime of the detector material. The damaged crystalline layer may be formed by a heavy diffusion of $10^{19}$ or above atoms/centimeter$^3$.

We claim:

1. A method for restoring after detector fabrication high radiant energy sensitivity in crystalline extrinsic detector material doped with dopant atoms to provide a predetermined energy level located between the valence and conduction band of the detector material comprising the steps of:

forming a layer having a damaged crystalline lattice structure in said detector material and raising the temperature of said detector material above 900° C. for a period of time to allow impurity atoms of a first type which diffuse readily throughout said detector material at times said material is above 900° C. to be trapped by said damaged crystalline lattice structure to enhance the majority carrier lifetime of the detector material whereby the number of ionized dopant atoms is reduced.

2. The method of claim 1 wherein said step of forming includes the step of diffusing a high concentration of impurity atoms of a second type to alter and disrupt the crystalline lattice structure.

3. The method of claim 2 wherein said step of diffusing continues until a concentration of at least $10^{19}$ atoms cm$^{-3}$ is formed in said layer.

4. The method of claim 2 wherein said step of diffusing continues until the depth of said layer is in the range from 0.7 to 1 micrometers.

5. The method of claim 2 wherein said step of diffusing includes the step of diffusing phosphorus.

6. The method of claim 1 further including the step of removing said damaged crystalline lattice structure.

7. The method of claim 6 wherein said step of removing includes the step of chemically etching said damaged crystalline lattice structure.

8. The method of claim 1 wherein said impurity atoms of a first type are from the group consisting of gold, silver, nickel and copper and mixtures thereof.

* * * * *